US006882582B2

(12) United States Patent
Sicard et al.

(10) Patent No.: US 6,882,582 B2
(45) Date of Patent: Apr. 19, 2005

(54) EEPROM CIRCUIT VOLTAGE REFERENCE CIRCUIT AND METHOD FOR PROVIDING A LOW TEMPERATURE-COEFFICIENT VOLTAGE REFERENCE

(75) Inventors: Thierry Sicard, Toulouse (FR); Eric Scott Carman, Cernex (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/362,467
(22) PCT Filed: Mar. 29, 2002
(86) PCT No.: PCT/EP02/03700
§ 371 (c)(1), (2), (4) Date: Feb. 19, 2003
(87) PCT Pub. No.: WO03/003378
PCT Pub. Date: Jan. 9, 2003

(65) Prior Publication Data
US 2004/0004800 A1 Jan. 8, 2004

(30) Foreign Application Priority Data
Jun. 26, 2001 (EP) .............................................. 01401682

(51) Int. Cl.[7] ................................................ G11C 7/00
(52) U.S. Cl. ............................ 365/189.09; 365/185.01; 323/284
(58) Field of Search ....................... 365/185.01, 185.03, 365/185.18, 189.09; 323/280, 284

(56) References Cited

U.S. PATENT DOCUMENTS

| 4,559,694 A | * | 12/1985 | Yoh et al. .................... 438/275 |
| 5,319,370 A | | 6/1994 | Signore |
| 5,430,670 A | | 7/1995 | Rosenthal |
| 5,629,891 A | | 5/1997 | LeMoncheck |
| 5,995,413 A | * | 11/1999 | Holzmann et al. ...... 365/185.09 |
| 6,026,023 A | * | 2/2000 | Tonda ..................... 365/185.2 |
| 6,087,813 A | * | 7/2000 | Tobita ........................ 323/280 |

OTHER PUBLICATIONS

Carley, "Trimming Analog Circuits Using Floating–Gate Analog MOS Memory," IEEE Journal of Solid–State Circuits, Dec. 24, 1989, No. 6; pp. 1569–1575.

* cited by examiner

Primary Examiner—Van Thu Nguyen

(57) ABSTRACT

A voltage reference circuit (40) is provided for producing a low temperature-coefficient analogue trim value. A pair of EEPROMs (50 and 60) are arranged such that the trim value is the difference between two EEPROM transistor threshold voltages. The substantially temperature dependent components of threshold voltage cancel out leaving only the substantially temperature independent trim value. Therefor the temperature coefficient of the voltage reference circuit (40) is negligible.

8 Claims, 1 Drawing Sheet

EEPROM CIRCUIT VOLTAGE REFERENCE CIRCUIT AND METHOD FOR PROVIDING A LOW TEMPERATURE-COEFFICIENT VOLTAGE REFERENCE

FIELD OF THE INVENTION

This invention relates to voltage reference circuits and particularly though not exclusively to analogue trim values in integrated circuits.

BACKGROUND OF THE INVENTION

In the field of this invention it is known in integrated circuits to produce an analogue trim value that is used to trim a reference voltage produced by the integrated circuit. It is highly desirable that this trim value is substantially independent of temperature variations, especially in automotive applications where large temperature ranges are specified.

It is known to provide analogue trim values using fuses, zener zaps and EEPROMs to provide digital trim information to trim a voltage. It is also known to use EEPROMs and resistors together to store analogue trim information. However, a problem with these arrangements is that although a voltage may be trimmed precisely at a given temperature, the nature of analogue signals means that this precision is not well maintained over a range of temperatures. For an integrated circuit used in an automotive application, the operable temperature range may typically be −40° C. to 125° C.

What is needed is an arrangement in which an analogue trim value is provided which is substantially temperature independent over such a temperature range. In other words, the trim value must have a negligible temperature coefficient.

It is an object of the present invention to provide an EEPROM circuit, a voltage reference circuit and a method for producing a low temperature-coefficient voltage reference wherein the abovementioned disadvantages may be alleviated.

SUMMARY OF THE INVENTION

In accordance with a first aspect of the present invention there is provided an EEPROM circuit for providing a low temperature-coefficient voltage, comprising first and second EEPROM cells having first and second transistor threshold voltages and first and second control electrodes respectively, the first and second control electrodes being coupled together wherein the first threshold voltage is programmable independently of the second threshold voltage, such that the low temperature-coefficient voltage is provided as a voltage differential between the first and the second threshold voltages.

In accordance with a second aspect of the present invention there is provided a voltage reference circuit comprising: the EEPROM circuit in accordance with the first aspect of the invention; a bandgap reference circuit (90); and a current mirror (80) coupled between the EEPROM circuit (45) and the bandgap reference circuit (90), for transferring a scaled voltage value to the bandgap reference circuit (9), Wherein the scaled voltage value is a scaled proportion of the low temperature-coefficient voltage.

In accordance with a third aspect of the present invention there is provided a method for providing a low temperature-coefficient voltage, the method comprising the steps of: programming a threshold voltage of a control electrode of a first EEPROM cell at a first voltage level: and, programming a threshold voltage of a control electrode of a second EEPROM cell at a second voltage level, the control electrode of the second EEPROM cell being coupled to the control electrode of the first EEPROM cell Wherein the low temperature-coefficient voltage is provided as a voltage differential between the first and the second threshold voltages.

The first threshold voltage is preferably programmed independently of the second threshold voltage via a switch arrangement coupled between the first and second control electrodes of the first and second EEPROM cells respectively.

Preferably the step of programming the threshold voltage of the control electrode of the second EEPROM cell includes the step of switching a switch arrangement coupled between the control electrodes of the first and second EEPROM cells. The low temperature-coefficient voltage is preferably an analogue trim value for trimming a reference voltage.

In this way low temperature-coefficient analogue trim values are provided, which are particularly beneficial when used to trim voltage values in automotive applications where an integrated circuit may have an operational temperature range of typically −40° C. to 125° C.

BRIEF DESCRIPTION OF THE DRAWINGS

One circuit and method for producing a low temperature-coefficient analogue trim value incorporating the present invention will now be described, by way of example only, with reference to the accompanying drawings, in which.

DESCRIPTION OF PREFERRED EMBODIMENTS

Figure 1:
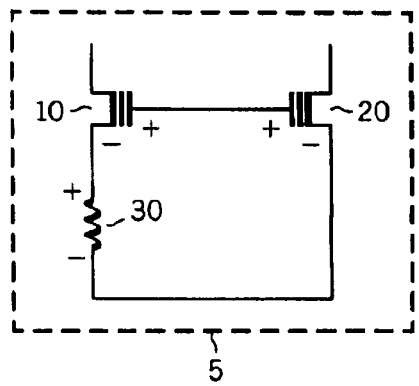
FIG. 1 shows an illustrative circuit diagram of an EEPROM circuit having two EEPROM cells arranged to provide an analogue trim voltage in accordance with the present invention.

Referring to FIG. 1, there is shown an illustrative circuit diagram showing an arrangement 5, including first and second EEPROM cells 10 and 20 respectively and a resistor 30. The first EEPROM cell 10 has a threshold voltage VT10 and the second EEPROM cell has a threshold voltage VT20.

The resistor 30 develops a trim voltage VR which is the difference between the threshold voltages VT10 and VT20 of two EEPROM cells 10 and 20 respectively.

Figure 2:
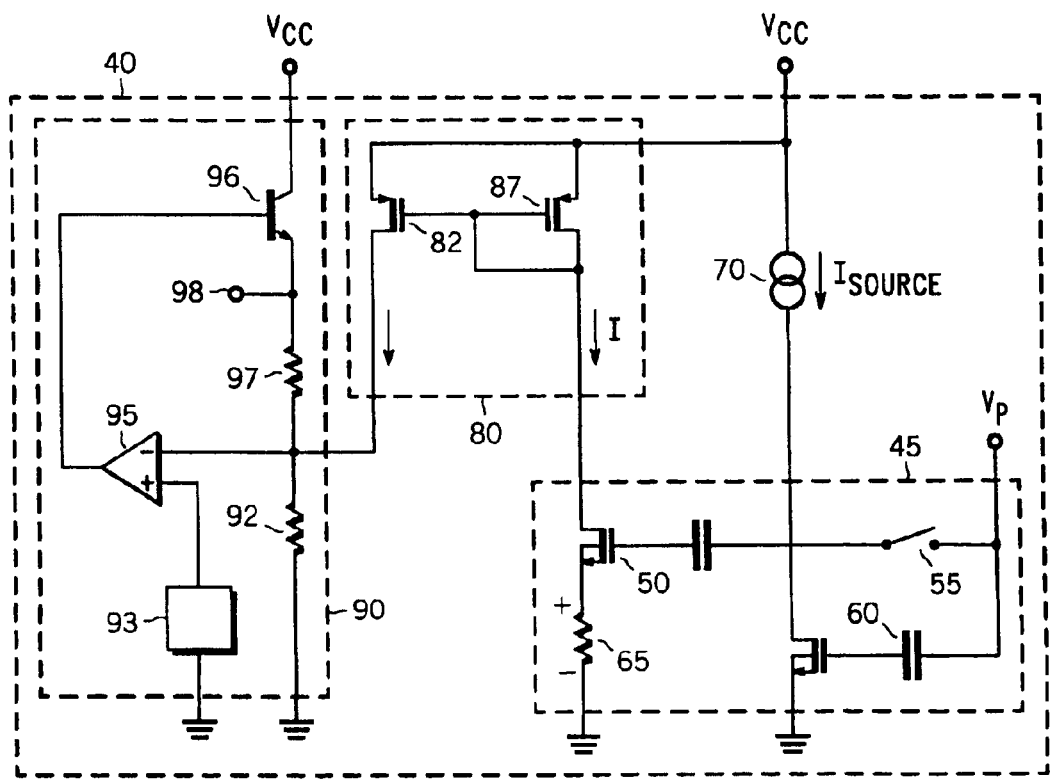
FIG. 2 shows a circuit diagram of a voltage reference circuit according to the present invention, using the arrangement of FIG. 1.

Referring now also to FIG. 2, there is shown a practical implementation 40 of the arrangement 5, in which the difference in threshold voltages between two EEPROM cells is used to trim the voltage of a band-gap reference.

Implementation 40 includes an EEPROM arrangement 45, a current source 70, a current mirror 80, and a bandgap reference circuit 90.

The EEPROM arrangement 45 has first and second EEPROM cells 50 and 60 respectively, coupled in a similar fashion to that of the arrangement 5. Each of the EEPROM cells 50 and 60 respectively has source, gate and drain electrodes. A switch 55 is coupled between the gate electrodes of the EEPROM cells 50 and 60 respectively, and the switch is also coupled to a programming voltage Vp to be further described below. The source electrode of the first EEPROM cell 50 is coupled to ground via a resistor 65 which is arranged to develop a voltage VEE to be further described below. The source electrode of the second EEPROM cell 60 is coupled directly to ground.

The current source 70 is coupled between a power supply voltage Vcc and the drain electrode of the second EEPROM cell 60. The current mirror comprises first and second transistors 82 and 87 respectively, which each have source, gate and drain electrodes. The source electrodes of the first and second transistors 82 and 87 respectively are coupled to the power supply voltage Vcc. The drain electrode of the second transistor 87 is coupled to the drain electrode of the first EEPROM cell 50 of the arrangement 45, and also to the gate electrodes of both the first and second transistors 82 and 87 respectively. The drain electrode of the first transistor 82 is coupled to the bandgap reference circuit in a manner to be further described below.

The bandgap reference circuit 90 comprises a differential amplifier 95, a bipolar transistor 96, first and second resistors 92 and 97 and a bandgap voltage source 93. The differential amplifier 95 has a non-inverting input coupled to the voltage source 93, an inverting input coupled to ground via the first resistor 92 and coupled to the drain electrode of the first transistor 82 of the current mirror 80 and an output.

The bipolar transistor 96 has a base electrode coupled to the output of the differential amplifier 95, a collector electrode coupled to the power supply voltage Vcc and an emitter electrode coupled to the inverting input of the differential amplifier 95 via the second resistor 97, and to a reference voltage node 98, arranged to provide a reference voltage VREF.

In operation the voltage VEE across resistor 65 is the difference between the thresholds of the first and second EEPROM cells 50 and 60 respectively. The threshold of the second EEPROM cell 60 may be adjusted by programming using the programming voltage VP when the switch 55 is open. In this way the first EEPROM cell 50 remains unprogrammed. During normal operation of the circuit 40 the switch 55 is closed.

In the circuit 40 of FIG. 2, the output reference voltage VREF is given by:

$$V_{REF} = V_{BG} \cdot \frac{R_1 + R_2}{R_1} - V_{EE} \cdot \frac{R_2}{R_3} \qquad \text{Equation 1}$$

The voltage VEE is scaled by resistors 97 and 65 and subtracted from a bandgap voltage VBG of the band-gap voltage source 93 (which in this example is 1.2V). The band-gap voltage VBG has a low temperature coefficient (TC), but the Integrated Circuit fabrication process causes about 3.5% variation in VBG at 1 standard deviation.

VEE is linearly adjustable and has a low TC. The circuit 40 therefore has the advantages that VEE is scaled down and therefore variation in VEE is also scaled down. Furthermore, in the case of EEPROM failure VREF returns to its untrimmed value.

Most of the temperature sensitive parameters affecting the threshold voltage of a transistor are due to the silicon substrate characteristics and not the gate oxide or polysilicon gate characteristics. When an EEPROM is programmed, charge is stored on the gate of the EEPROM. Regardless of whether an EEPROM is programmed or not the silicon characteristics remain unchanged (unless many cycles of program and erase are performed). Therefore the EEPROM threshold temperature dependency is controlled by the silicon parameters and these silicon parameters can be subtracted out leaving only the stored charge component.

The TC of an EEPROM cell threshold voltage is substantially independent of charge stored. In other words the TC of the EEPROM threshold remains almost exactly the same regardless of the amount of charge stored on an EEPROM gate. The mean change in TC between erased and programmed states of a typical EEPROM is only 0.14 mV/C.

EEPROM cells will normally lose some of their stored charge during their lifetime so the trim value can be expected to vary slightly over time. VEE is scaled down by resistors R2 and R3, so that any variation in VEE will also be scaled down. Temperature accelerates charge loss. Over its life, the under-bonnet area of an automobile will spend typically 500 hours at 150° C. and the rest of the time below 110° C. Since charge loss is highly temperature dependent the time spent at less than 110° C. can be neglected.

Though the reference circuit itself has a non-negligible TC, the analogue trim circuit adds almost no temperature dependence to VREF. In the above embodiment the analogue trim circuit only changes the temperature dependence by 0.05 mV/C.

It will be understood that the circuit and method for producing a low temperature-coefficient analogue trim described above provides the following advantages:

At least one fundamental difference between the present invention and a prior art arrangements in which EEPROM cells are used to store trim values is that the trim value of the present invention is stored as the difference between two EEPROM thresholds rather than as the value of a single programmed EEPROM cell.

Therefore one advantage of the present invention for trimming voltage references is that the TC of the trim value is negligible. Other known solutions using digital trim to selectively switch resistors have a high TC because the TC of resistors is high. Solutions for analogue trim using single EEPROM cells have much higher TCs because the EEPROM threshold has a large TC.

An additional advantage is that the circuit 40 is much smaller than other arrangements such as a digital trim arrangement using EEPROM cells. Trimming using an array of EEPROM cells requires a larger semiconductor area and involves high power consumption, high voltage switching circuitry.

It will be appreciated that embodiments other than those mentioned above are possible. For example, the exact arrangements of the bandgap reference circuit and the current mirror may differ from those described above.

What is claimed is:

1. An EEPROM circuit for providing a low temperature-coefficient voltage, comprising first and second EEPROM cells having first and second transistor threshold voltages and first and second control electrodes respectively, the first and second control electrodes being coupled together, wherein the first threshold voltage is programmable independently of the second threshold voltage, such that the low temperature-coefficient voltage is provided as a voltage differential between the first and the second threshold voltages.

2. The EEPROM circuit of claim 1 wherein the first threshold voltage is programmed independently of the second threshold voltage via a switch arrangement coupled between the first and second control electrodes of the first and second EEPROM cells respectively.

3. A voltage reference circuit comprising:

an EEPROM circuit for providing a low temperature-coefficient voltage, comprising;

first and second EEPROM cells having first and second transistor threshold voltages and first and second control electrodes respectively, the first and second control electrodes being coupled together, wherein the first threshold voltage is programmable independently of the second threshold voltage, such that the low temperature-coefficient voltage is provided as a voltage differential between the first and the second threshold voltages; and a bandgap reference circuit; and a current mirror coupled between the EEPROM circuit and the bandgap reference circuit, for transferring a scaled voltage value to the bandgap reference circuit, wherein the scaled voltage value is a scaled proportion of the low temperature-coefficient voltage.

4. A method for providing a low temperature-coefficient voltage, the method comprising the steps of:

programming a threshold voltage of a control electrode of a first EEPROM cell at a first voltage level; and, programming a threshold voltage of a control electrode of a second EEPROM cell at a second voltage level, the control electrode of the second EEPROM cell being coupled to the control electrode of the first EEPROM cell;

wherein the low temperature-coefficient voltage is provided as a voltage differential between the first and the second threshold voltages.

5. The method of claim 4 wherein the step of programming the threshold voltage of the control electrode of the second EEPROM cell includes the step of switching a switch arrangement coupled between the control electrodes of the first and second EEPROM cells.

6. The EEPROM circuit of claim 1 wherein the low temperature-coefficient voltage is an analogue trim value for trimming a reference voltage.

7. The method of claim 4 wherein the low temperature-coefficient voltage is an analogue trim value for trimming a reference voltage.

8. A voltage reference circuit, according to claim 3 wherein the first threshold voltage is programmed independently of the second threshold voltage via a switch arrangement coupled between the first and second control electrodes of the first and second EEPROM cells, respectively.

* * * * *